United States Patent [19]

Lafrate et al.

[11] Patent Number: 5,705,824
[45] Date of Patent: Jan. 6, 1998

[54] FIELD CONTROLLED CURRENT MODULATORS BASED ON TUNABLE BARRIER STRENGTHS

[75] Inventors: Gerald J. Lafrate; Jun He, both of Raleigh, N.C.; Mitra Dutta, Tinton Falls, N.J.; Michael A. Stroscio, Durham, N.C.

[73] Assignee: The United States of America as represented by the Secretary of the Army, Washington, D.C.

[21] Appl. No.: 497,672

[22] Filed: Jun. 30, 1995

[51] Int. Cl.[6] .................. H01L 29/88; H01L 29/775
[52] U.S. Cl. .................. 257/23; 257/25; 327/570; 330/277
[58] Field of Search .................. 257/23, 25; 327/570, 327/564; 326/47, 49, 102; 330/277; 332/102

[56] References Cited

U.S. PATENT DOCUMENTS

| H1570 | 8/1996 | Lux et al. ............................... 257/25 |
| 3,121,177 | 2/1964 | Davis .................................. 257/25 |
| 4,769,683 | 9/1988 | Goronkin ............................... 257/20 |

OTHER PUBLICATIONS

Chou et al, *App Phys. Lett* 55 (2) 10 Jul. 1989 "Observation ... Transistor" pp. 176–178.

Sakaki, H., "Quantum Wire Superlattices and Coupled Quantum Box Arrays: A Novel Method to Suppress Optical Phonon Scattering in Semiconductors", Japanese Journal of Applied Physics, 28, L314, 1989.

Luryi, S. et al, "Resonant tunneling of two-dimensional electrons through a quantum wire: A negative transductance device", Applied Physics Letters, 47, 1347, 1985.

Tsuchiya, M. et al., "Optical Anisotropy in a Quantum-Well- Wire Array with Two-Dimensional Quantum Confinement", Physical Review Letters, 62, 466, 1989.

Reed, M.A. et al, "Observation of Discrete Elec-ronic States in a Zero-Dimensional Semiconductor Nanostructure", Physical Review Letters, 60, 535, 1988.

Stroscio, M.A., "Interaction between longitudinal-optical-honon modes of a rectangular quantum wire and charge carriers of a one-dimensional electron gas", Physical Review, B40, 6428, 1989.

Kim, K.W. et al, "Electron-optical-phonon scattering rates in a rectangular semiconductor quantum wire", Journal of Applied Physics, 70, 319, 1991.

*Primary Examiner*—Jerome Jackson
*Attorney, Agent, or Firm*—Michael Zelenka; William H. Anderson; George B. Tereschuk

[57] ABSTRACT

A carrier transport media is doped with impurities or includes barrier structures within or on the carrier transport media and a sinusoidally alternating external electric field(s) with frequencies equal to the Bloch frequency divided by an integer is applied to the carrier transport media to alter the effective barriers of the impurities or barrier structures to an arbitrarily large potential compared to the zero field barrier potential. The various impurities or barrier structures are band engineered and deposited, grown or implanted in the carrier transport media and can take any form such as barrier layers in or on the transport media, laterally induced barriers, and impurities or defects in the carrier transport media. The application of time-dependent external fields across a length of nanoscale or mesoscopic structure leads to an effective renominalization of the barrier potential strengths when the frequency of the applied electric field multiplied by an integer is equal to the Bloch frequency. Under these conditions the transmission probability is altered and the current ratio, $i_2/i_1$, will be modulated strongly.

14 Claims, 3 Drawing Sheets

FIELD CONTROLLED CURRENT MODULATORS BASED ON TUNABLE BARRIER STRENGTHS

GOVERNMENT INTEREST

The invention described herein may be made, used, sold, imported, and/or licensed by, or on behalf of, the United States of America without the payment to us of any royalties thereon.

FIELD OF THE INVENTION

The present invention relates to the field of electronic and optoelectronic devices used in signal and information processing and more particularly to current flow controller elements in mesoscopic scale signal processing devices.

BACKGROUND OF THE INVENTION

Tunneling phenomena in quantum wells and superlattices have been studied extensively for potential applications in quantum devices. In particular, many analyses and numerical simulations have been focused on double barrier structures. Background information on these structures can be found in texts such as *Quantum Mechanics* by Merzbacher, Wiley & Sons, New York, N.Y., 1970. Theoretical calculations have affirmed that resonant tunneling occurs for free electrons in the double barrier structure and for Bloch electrons in one dimensional nearest-neighbor tight-binding band within double potential barriers. Articles, such as those by Stovneng et al, Phys. Rev., B44, 13582, 1991, describe these calculations.

As originally proposed by H. Sakaki in the *Japanese Journal of Applied Physics*, 19, L735, 1980, the predicted high mobilities of quasi-one-dimensional wire-like regions of semiconducting material underlie many proposed quantum-wire system concepts. An example of such a system concept is a quantum-wire array, which is described by H. Sakaki in *Japanese Journal of Applied Physics*, 28, L314, 1989. Enhanced carrier mobility is achieved in this quantum-wire array by engineering the minibands of the array so that longitudinal-optical (LO) phonon transitions are forbidden.

A second example of a semiconductor quantum wire device is a novel three-terminal resonant-tunneling structure which is based on resonant tunneling of a two-dimensional electron gas into a gated one-dimensional quantum wire and which produces a negative transconductance. S. Luryi et al, *Applied Physics Letters*, 47, 1347, 1985. The experimental realization of this device portends applications for low-power logic circuits.

Quantum wire arrays have also been considered as potential low-current-threshold semiconductor lasers; in fact, there have been indications of strong optical anisotropy in such quantum wire arrays, see M. Tsuchiya et al, *Physical Review Letters*, 62, 466, 1989. Other efforts on the fabrication and characterization of quantum wire structures have been reported by M. A. Reed et al, *Physical Review Letters*, 60, 535, 1988 in connection with quantum-coupled electron device architectures and by M. Watt et al, *Semiconductor Science and Technology*, 5, 285, 1990.

Recently, theoretical studies of the interaction between LO phonons and carriers in polar-semiconductor quantum wires have also been performed and described in such articles by M. A. Stroscio, *Physical Review*, B40, 6428, 1989, wherein the presence of discrete LO phonon modes similar to those polar-semiconductor quantum wells are discussed. As for quantum wells, interface LO phonons are established at the semiconductor-semiconductor boundaries of quantum wires. This effect is described by K. W. Kim et al in *Journal of Applied Physics*, 70, 319, 1991 where interface-phonon scattering effects are demonstrated to be a major source of scattering for electrons confined in the extreme quantum limit for wires with lateral dimensions less than about 40 Angstroms.

However, heretofore no one has proposed a method to provide current modulators that are fundamental elements of nanoscale and mesoscopic devices and systems while providing efficient and application specific information processing. The present invention addresses this need.

SUMMARY OF THE INVENTION

Accordingly, one object of the present invention is to provide a novel method of controlling the current flow through quantum wire semiconductor devices.

Another object of the invention is to provide novel current modulators which are anticipated to be used as fundamental elements of nanoscale and mesoscopic devices and systems with efficient and application specific information processing.

Still another object of the present invention is to provide a way of tuning and controlling currents in nanoscale and mesoscopic structures through field controlled tuning of the potential barrier strengths of either band engineered barriers or impurities in the structures.

These and other objects of the invention are accomplished by providing a carrier transport medium which has impurities or barrier structures within or on the carrier transport medium and sinusoidally alternating external electric fields with frequencies equal to the Bloch frequency divided by an integer to alter the effective barriers of the impurities or barrier structures to an arbitrarily large potential compared to the zero field barrier potential. The various impurities or barrier structures are band engineered and deposited, grown or implanted in one or more of the carrier transport media and can take any form such as barrier layers in or on the transport media, laterally induced barriers, and mere impurities or defects in the carrier transport media.

The application of time-dependent external fields across a length of nanoscale or mesoscopic structure leads to an effective renormalization of the barrier potential strengths when the frequency of the applied electric field multiplied by an integer is equal to the Bloch frequency. Under these conditions the transmission probability is altered and the current ratio, $i_2/i_1$, will be modulated strongly.

The elements of the nanoscale or mesoscopic structures (hereinafter sometimes referred to as quantum sized) that produce the potential barrier regions may take many forms depending on the application of the device according to the present invention. The potential barriers may be displaced within the plane(s) of current path such that the current will pass through the barrier; the potential barriers may be laterally grown to form a layered structure which includes a current carrying two dimensional gas; or the potential barriers may be isolated impurities that are doped, implanted, etc. into or along a current path of a nanoscale or mesoscopic structure or network.

BRIEF DESCRIPTION OF THE DRAWINGS

These and other features of the invention will be readily understood in light of the following Detailed Description of the Invention and the attached drawings wherein.

It should be noted that the illustrations described above have not been drawn to scale. The preferred dimensions are in the general range of tens of Angstroms to several thousand Angstroms depending on the particular embodiment and the carrier energies selected for a particular device or network of devices.

DETAILED DESCRIPTION OF THE INVENTION

The present invention involves a method and device which utilizes Bloch electron transport caused by inhomogeneous electric field due to localized impurities and the dynamics of the Bloch electrons in homogeneous electric fields in the presence of impurities. The current modulators according to the present invention may be used as fundamental elements of nanoscale and mesoscopic devices and systems with efficient and application specific information processing capabilities. Essentially, the present invention provides a way of tuning and controlling currents in these nanoscale and mesoscopic structures by controlling the field of the potential barrier strengths of either band engineered barriers or impurities formed in the structures. The principal advantage of the present method and devices is that the current output of the device according to the present invention can be controlled sensitively through extremely large field-controlled tuning of these potential strengths which are associated with the impurities or band-engineered barriers.

However, in order to fully understand the characteristics of the present invention a detailed explanation of the theory behind the present invention is necessary.

I. INTRODUCTORY THEORY

The following explanation details Bloch electron transport in inhomogeneous electric fields which are associated with localized impurities or barriers and the dynamics of the Bloch electron in homogeneous electric fields in the presence of such impurities or barriers. Specifically, the tunneling of a Bloch electron through single and double Slater-Koster type impurity potential barriers, respectively, and tunneling of a Bloch electron in devices with localized impurities or barriers under the influence of external electric fields will be explained. This theory illustrates the key features underlying field-controlled current modulators based on tunable impurity barrier strengths; however, the analytical theory is not intended to model the detailed features of every device embodiment.

Typically, the Bloch representation is used for the calculation of quantum transport involving the Bloch electron in a homogeneous electric field. However, this representation is difficult to use in situations where the inhomogeneity is localized and nonperturbative in strength, such as localized impurities. This difficulty has been overcome by a derivation by Iafrate et al in Phys. Rev. B40, 6144 (1989) in which Bloch electron dynamics and quantum transport in inhomogeneous electric fields of arbitrary strength and time dependence, which includes all possible quantum effects, i.e., intraband and interband scattering, interband Zener tunneling, and non-linear transient transport, are explained. For purposes of the present invention and this explanation of the theory behind the present invention, this previous derivation is modified. In the previous derivation, the electric field is described through the use of the vector potential. The choice of the vector potential gauge leads to a natural set of basis function for describing Bloch electron dynamics. The derivation also uses the localized Wannier representation, in which the complete set of Wannier functions is used as a basis function. These functions are inherently localized, thus making them most convenient for discussing localized inhomogeneous fields and the localized states arising from the inhomogeneity.

In the localized Wannier representation, the wave function of the electron is generally expressed as:

$$\psi(\vec{r},t) = \sum_n \sum_l f_n(\vec{l},t) W_n(\vec{r}-\vec{l},t)$$

where $f_n(\vec{l},t)$ is the envelope function in the instantaneous Wannier representation, $W_n(\vec{r}-\vec{l},t)$ is the time-dependent Wannier function, and "n" indexes the band. The general differential equation for the time-dependent envelope function was derived in the Iafrate reference, and in the single-band approximation, this differential equation is given by:

$$i\hbar \frac{\partial f_n(\vec{r},t)}{\partial t} = \epsilon_n\left(-i\vec{\nabla} - \frac{e}{\hbar c}\vec{A}\right)f_n(\vec{r},t) + \sum_{l'} eV_n(\vec{l},\vec{l'},t)f_n(\vec{l'},t)$$

where $\epsilon_n(\vec{K})$ is the Bloch energy band function with crystal momentum $\vec{K}$, A is the vector potential due to the field of the spatially homogeneous part, E, with, $$\vec{A} = -c\int_0^t \vec{E}dt',$$

and $V_n(r,r,t)$ are the matrix elements of the inhomogeneous potential with respect to the localized basis function, which is defined by $$V_n(\vec{1},\vec{1}';t)=\int d\vec{x}\, W_n(\vec{x}-\vec{1}';t)V(\vec{x},t)(W_n(\vec{x}-\vec{1},t).$$

To illustrate the physics of a Bloch electron tunneling through potential barriers under the influence of an external homogeneous electric field, the derivation given above can be applied to the single and the double Slater-Koster type impurity potentials in a one-dimensional lattice structure with the single band nearest-neighbor tight-binding approximation. Although the Slater-Koster potential is chosen for simplicity, this method can be extended to general localized inhomogeneous potentials. The Green's function for the zero field (E=0) case, as well as the field dependent Green's function for the constant field (E=E$_o$) case, may then be derived with in the one dimensional nearest-neighbor tight-binding approximation. Using the Green's functions, the envelope function is constructed and the transmission coefficients are calculated. The exact transmission coefficients for the single and double impurity barriers are obtained for the zero-field nearest neighbor tight binding band which shows the resonances for the double barrier structure. The Stark energy spectra of Bloch electrons in electric fields with impurities are then calculated for the single and double Slater-Koster impurity structures and, then, the time evolution of the envelope function due to the impurities as well as the external fields are determined. The results for the zero-field and the constant field calculations are employed to identify the resultant band deformation caused by a superimposed DC and AC electric fields. With the DC and/or AC component of the current derived therefrom, the requisite transmission coefficients for tunneling through the impurity barriers under specific tuning conditions may be defined to use the present invention in any number of applications.

Tunneling of the Bloch Electron in a Zero Electric Field

In order to fully understand the dynamics of the present invention, the tunneling of the Bloch electron in a zero electric field must be discussed. For the results of the zero-field calculations, or when the electric field is turned off, the tunneling or scattering of a Bloch electron, due to the localized inhomogeneous potentials in a given energy band, is a stationary problem. The transmission coefficients and the current densities for the Bloch electron tunneling through the potential barriers can be calculated through the use of the Green's function method. In this section, the method for examining the transport of a Bloch electron in the one dimensional nearest-neighbor, tight-binding band with single and double impurity potential barriers will be summarized.

Using the general differential equation for the time dependent envelope function, given above, noting that for E=0, the vector potential A will also equal 0, and seeking a solution for the general differential equation in the form:

$$f_n(\vec{r},t)=F_n(\vec{r})e^{-\frac{i}{\hbar}E_n t},$$

where $F_n(\vec{r})$ is the time dependent part of the envelope function, and $E_n$ is the separation constant (the energy of the Bloch electron), the time dependent differential equation for $F_n(\vec{r})$ is:

$$(E_n - \epsilon_n(-i\vec{\nabla}))F_n(\vec{r}) = \sum_{\vec{r}'} V_n(\vec{r},\vec{r}')F_n(\vec{r}')$$

where the sum on the right hand side covers the entire range of the inhomogeneous potential. Based on this derivation, this equation can be used to treat any localized inhomogeneous potential. Ideally, if $V_n(\vec{r},\vec{r}')$ is confined to a few lattice spacings, a finite difference problem is solved with only minor difficulty. Thus, this equation for the impurity problems is solved by finding the Green's function for the unperturbed Hamiltonian (the system without the impurities), by writing the solution of the previous equation in a Lippmann-Schwinger form, and by determining the impurity levels and a Bloch electron envelope function from these Lippmann-Schwinger equations.

To find the Green's function $G_o(\vec{r},\vec{r}')$ for the unperturbed Hamiltonian of the general differential equation for the time dependent envelope function, $G_o$ should satisfy the equation:

$$[\epsilon_n(-i\vec{\nabla})-E_n]G_o(\vec{r},\vec{r}')=-\delta_{\vec{r},\vec{r}'}$$

for the given energy band $\epsilon_n(\vec{K})$. By satisfying this equation, it can be shown that the solution to this inhomogeneous differential equation is, $$G_0(\vec{r},\vec{r}')=\frac{1}{N}\sum_K \frac{e^{i\vec{K}\cdot(\vec{r}-\vec{r}')}}{E_n - \epsilon_n(\vec{K})},$$

where the summation is over all possible values of "$\vec{K}$".

To demonstrate this method, the one dimensional linear chain model within the nearest-neighbor tight-binding approximation will be discussed. The dispersion relation associated with the Bloch state in the one-dimensional nearest-neighbor tight-binding approximation is $$\epsilon_n(K)=\epsilon_o+2\epsilon_1 \cos Ka$$

where "a" is the spacing between the atoms. By converting the sum in the Green's equation above into an integral, the summation of the Green's equation can be evaluated for the energy dispersion of the previous equation, and the explicit forms of Green's function are then obtained.

For energy values outside the unperturbed band, |x|>1, where "x" is defined by $x=(E_n-\epsilon_o)/2\epsilon_1$, the Green's function is found to be:
where "u" is defined by $|x|=|(E_n-\epsilon_o)/2\epsilon_1|=\cos h\, u$, and the $$G_0(\vec{r},\vec{r}')=\frac{1e^{-u|\vec{r}-\vec{r}'|}}{2\epsilon_1 \sinh u}$$

Green's function decays exponentially as the distance |r−r'| increases. Whereas, for energies inside the unperturbed band, i.e. |x|<1, the retarded Green's function is:

$$G_0(\vec{r},\vec{r}')=\frac{i}{2\epsilon_1 \sin u} e^{iu|\vec{r}-\vec{r}'|}$$

where "u" is defined by $x=(E_n-\epsilon_o)/2\epsilon_1=\cos u$, the Green's function refers to the propagation of the Bloch electron to "plus infinity".

With the explicit Green's functions derived, the solution of time dependent differential equation can be derived for lattices containing either one or a plurality of Slater-Koster impurities. The solution for the time independent envelope function, in the Lippmann-Schwinger form, is written as:

$$F_n(r) = gF_n^0(r) + \sum_l \sum_{l'} V_n(l,l')G_0(r,l)F_n(l')$$

where $F^0{}_n(r) = e^{iur}$ is the time independent envelope function for the unperturbed Bloch state in the Wannier representation, the summations are over all lattice sites, and "g" is a constant (for in-band energy, g=1 corresponds to continuum states, and for in-gap energy, g=0 corresponds to discrete bounded states).

To illustrate this method, the well known Slater Koster localized potential equation which indicates a single impurity of strength $V_o$ located on the site $l_o$ is used. For the in-gap energy, the time independent envelope function for the Bloch electron at any lattice site "r" is $$F_n(r) = V_o G_o(r,l_o) F_n(l_o)$$

Letting $l = l_o$ in this equation and using the explicit form of the Green's function for the unperturbed band, given above, for $G_o(r,l_o)$, the impurity energy levels for the single Slater-Koster impurity is given by $$E_n = \epsilon_0 \pm 2\epsilon_1 \sqrt{1 + \left(\frac{V_0}{2\epsilon_1}\right)^2}$$

The envelope function for the bound state decays as the distance from the impurity increases as, $$F_n(r) = e^{-u|r-l_0|} F_n(l_0), \quad u = \cosh^{-1}\sqrt{1 + (V_0/2\epsilon_1)^2}$$

with a decay length of $\lambda \sim 1/u$.

However, if the energy lies within the band, the envelope function can be written as $$F_n(r) = e^{iur} + V_o G^+{}_o(r,l_o) F_n(l_o),$$

where $e^{iur}$ is the solution of the homogeneous equation. The matching condition at the site impurity $l_o$, i.e., the continuity of the envelope function at the impurity site $l_o$, leads to the solution of the time independent differential equation for a single impurity as $$F_n(r) = \begin{cases} e^{iur} + \sqrt{R}\, e^{-iur} = e^{iur} + \dfrac{i\frac{V_o}{2\epsilon_1 \sin u} e^{i2ul_o}}{1 - i\frac{V_o}{2\epsilon_1 \sin u}} e^{-iur}, & r < l_o \\ \sqrt{T}\, e^{iur} = \dfrac{1}{1 - i\frac{V_o}{2\epsilon_1 \sin u}} e^{iur}, & r > l_o \end{cases}$$

where R is the reflection coefficient for the Bloch electron reflected by the impurity barrier, $$R = \frac{(V_o/2\epsilon_1 \sin u)^2}{1 + (V_o/2\epsilon_1 \sin u)^2}$$

and T is the transmission coefficient for the Bloch electron tunneling through the impurity, $$T = \frac{1}{1 + (V_o/2\epsilon_1 \sin u)^2}$$

It should be noted that T is always less than 1 for the single impurity case, with no resonances for the single impurity barrier structure.

However, unlike the single impurity case, several different phenomena occur when two or more Slater-Koster type impurities are present in the crystal. These include impurity level splitting for the outside-band energy eigenvalues, and resonant tunneling for specific in-band energies. The impurity potential for the two Slater-Koster impurities is represented by:

$$V(r',r'') = V_o \delta_{r',l_o} \delta_{r'',l_o} + V_1 \delta_{r',l_1} \delta_{r'',l_1}$$

where $l_o, l_1$ denote the locations of the impurities, and $V_o, V_1$ denote the strength of the impurities. In accordance with the solution for the time-dependent envelope function in the Lippmann-Schwinger form, the solution of the time-independent envelope function for the in-gap energy is:

$$F_n(r) = V_o G_o(r,l_o) F_n(l_o) + V_1 G_o(r,l_1) F_n(l_1)$$

The continuity of the envelope function at lattice sites $l_o$ and $l_1$ give rise to two linear equations for $F_n(l_o)$ and $F_n(l_1)$. The non-trivial solutions of $F_n(l_o)$ and $F_n(l_1)$ require the determinant of the coefficient matrix of the linear equations be zero, which is expressed as, $$\begin{vmatrix} 1 - V_o G_o(l_o,l_o) & -V_1 G_o(l_o,l_1) \\ -V_o G_o(l_1,l_o) & 1 - V_1 G_o(l_1,l_1) \end{vmatrix} = 0$$

There are four roots associated with the above equation which correspond to the impurity levels. If $V_1 = V_o$, then the impurity energy levels can be expressed in a more explicit manner as, $$E_1^{\pm} = \epsilon_o + 2\epsilon_1 \left[ 1 + \left(\frac{V_o}{2\epsilon_1}\right)^2 (1 \pm e^{-ul})^2 \right]^{1/2}$$

where "l" is the distance between the two impurities. Since u=

$$E_2^{\pm} = \epsilon_o - 2\epsilon_1 \left[ 1 + \left(\frac{V_o}{2\epsilon_1}\right)^2 (1 \pm e^{-ul})^2 \right]^{1/2}$$

$\cosh^{-1}|(E^{\pm}{}_n - \epsilon_o)/2\epsilon_1|$, the above equation is a transcendental equation of $E^{\pm}{}_{1(2)}$, and therefore, $E^{\pm}{}_{1(2)}$ must be solved numerically. By solving for $E^{\pm}{}_{1(2)}$, it can be shown that the two energy levels $E^{+}{}_{1(2)}$ correspond to the symmetric functions of $F_n(r)$ defined about the center of these impurities, and $E^{-}{}_{1(2)}$ correspond to the antisymmetric functions of $F_n(r)$ about the center of these two impurities.

For the energy $E_n$ with the band $\epsilon_n(K)$, i.e. the energies belong to a continuous energy spectrum, the transmission and the reflection of the Bloch electrons must be considered. The envelope function for this case consists of two parts, $$F_n(r) = e^{iur} + [V_o G_o(r,l_o) f_n(l_o) + V_1 G_o(r,l_1) f_n(l_1)]$$

where the first part $e^{iur}$ is the solution for the unperturbed Hamiltonian, and the second part is due to the scattering from the inhomogeneities. Using the continuity conditions of the envelope function at sites $l_o$ and $l_1$, the solution of the general time independent differential equation for the Bloch electrons with in-band energy for the double barrier structure is obtained. This time independent envelope function is found to be: where $\alpha$ and $\beta$ are the notations introduced for simplicity, wherein $\alpha=V_o/2\epsilon_1 \sin u$, and $\beta=V_1/2\epsilon_1 \sin u$. The transmission $$F_n(r) = \begin{cases} e^{iur} + \dfrac{e^{i2ul}[i\alpha(1-i\beta)+i\beta(1+i\alpha)e^{i2ul}]}{(1-i\alpha)(1-i\beta)+\alpha\beta e^{i2ul}} e^{-iur}, r<l_o<l_1 \\ \dfrac{(1-i\beta)e^{iur}+[i\beta+\alpha\beta(1-e^{i2ul})]e^{-iur}}{(1-i\alpha)(1-i\beta)+\alpha\beta e^{i2ul}}, l_o<r<l_1 \\ \dfrac{1}{(1-i\alpha)(1-i\beta)+\alpha\beta e^{i2ul}} e^{iur}, r>l_1 \end{cases}$$

coefficient for the Bloch electron tunneling through the two impurity barriers is $$T = \left| \dfrac{1}{(1-i\alpha)(1-i\beta)+\alpha\beta e^{i2ul}} \right|^2$$

$$= \dfrac{1}{1+[2\alpha\beta\sin ul - (\alpha+\beta)\cos ul]^2 + (\alpha-\beta)^2\sin^2 ul}$$

If $V_o=V_1$, the two impurities are with the same strength, $$T = \dfrac{1}{1+4\left(\dfrac{V_o}{2\epsilon_1}\right)^2\left[\dfrac{V_o}{2\epsilon_1 \sin u}\sin ul - \cos ul\right]^2}$$

The resonant transmission (T=1) occurs when the energy of the electron $E_n$ satisfies the condition:

$$\dfrac{V_o}{2\epsilon_1 \sin u} \sin ul - \cos ul = 0$$

Thus, it has been shown that the number of resonance for the full range of the in-band energies equals the number of atoms between the two impurities, i.e. "l−1"; and the width of the resonances decreases as the impurity strength is increased. It is interesting to note that the tunneling of a Bloch electron through the impurity barriers is very analogous to the tunneling of a free electron through δ-function barriers. With these calculations, it can also be shown that the average velocity of the Bloch electron expressed in terms of the envelope function in Wannier representation for the nearest-neighbor tight-binding band is $$<v_n> = \dfrac{2\epsilon_1 a}{\hbar} Im\left[ \sum_l F_n(l)F^*_n(l-1) \right]$$

Further, from this equation, it can be shown that the average velocity of the Bloch electron equals the product of the transmission coefficient and the average velocity of the Bloch electron for the structure without any impurities, i.e., $<v_n>=T<v^o_n>$, where $<v^o_n>=(2\epsilon_1 a/\hbar)\sin u$ is the average velocity for the Bloch electron in the lattice without impurities.

In addition to the single and the double impurity structures given above, the transmission coefficient for "L" contiguous impurities of the same strength distributed along the lattice sites (double hetero-junction like structure) and an infinite number of impurities distributed along the half space may also be calculated in accordance with the above models.

Accordingly, given the above it is now appropriate to consider the effects of a DC field applied to a single and a double impurity model according to the present invention.

Effects of a DC Field

When a constant homogeneous electric field $E_o$ is applied to the crystal lattice, the vector potential is linearly time dependent, $A=-cE_o t$. This constant field causes Bloch oscillations for the system in the single band approximation while the energy spectrum forms a Wannier-Stark ladder with the spacing between ladders being "$eE_o a$". From this, the differential equation for the time-dependent envelope function in the Wannier representation in the single-band model may be derived as:

$$i\hbar \dfrac{\partial f_n(l,t)}{\partial t} = \sum_{l'} [\epsilon_n(l'-l,t) + V_n(l,l',t)]f_n(l',t)$$

where $\epsilon_n(l-l',t)$ is the Fourier component of the time-dependent energy band function $\epsilon_n(K-(e/\hbar_c)A)$. Note that $$\epsilon_n(l'-l,t)=e^{iw_B(l'-l)t}\epsilon_n(l'-l,0), V_n(l,l',t)=e^{iw_B(l'-l)t}V^o_n(l,l',t)$$

where $\epsilon_n(l'-l,0)$, $V^o_n(l,l',0)$ are time-dependent, and $w_B$ is the Bloch frequency $w_B=eE_o a/\hbar$. The time dependence of the single band model equation may be separated by writing the envelope function in the form of $$f_n(l,t) = F_n(l) e^{-i(\frac{\epsilon}{\hbar}+l w_B)t}$$

where "$\epsilon$" is a constant of separation, and the time independent part of the envelope function $F_n(l)$ satisfies the difference equation $$(\epsilon + l\hbar w_B)F_n(l) = \sum_{l'} [\epsilon_n(l'-l) + eV^o_n(l,l')]F_n(l')$$

In essence, this equation depicts an infinite set of equations for $\{F_n(l)\}$, which is mathematically solvable for the special case of the nearest-neighbor tight-binding approximation. For the nearest-neighbor tight-binding band with band dispersion given by one dimensional nearest-neighbor tight-binding approximation, this equation may be reduced to $$(\epsilon + l\hbar w_B)F_n(l) = \epsilon_o F_n(l) + \epsilon_1 F_n(l+1) + \epsilon_1 F_n(l-1) + \sum_{l'} V^o_n(l,l')F_n(l')$$

which can be solved by the Green's function method. To build the Green's function for this equation, it is first necessary to find the solution of the homogeneous equation:

$$(\epsilon+l\hbar w_B)F^{(o)}_n(l)=\epsilon_o F^{(o)}_n(l)+\epsilon_1 F^{(o)}_n(l+1)+\epsilon_1 F^{(o)}_n(l-1)$$

Since the recurrence relations of $F^{(o)}_n(l)$ in this equation are the same as that of the Bessel functions, the general solution of this equation is any linear combination of the Bessel functions of the first and the second kind, with an index "l+y" where $y=(\epsilon-\epsilon_o)/\hbar w_B$ and argument "$2\epsilon_1/\hbar w_B$". For an infinite crystal, the boundary condition that $F_n$ does not diverge for both limit l reaching $\pm\infty$ requires $y=\{m\}$, where m is an integer. Therefore, $J_{l+m}(2\epsilon_1/\hbar w_B)$ is the eigenfunction of this previous equation with an eigenvalue $\epsilon_m=\epsilon_o+m\hbar w_B$. Since $$\sum_m J_{l+m}J_{l'+m} = \delta_{l,l'}, \quad \sum_l J_{l+m}J_{l+m'} = \delta_{m,m'}$$

the eigenfunction $\{J_{l+m}\}$ form a complete set of orthogonal functions, which can be used as basis function for expansion of the envelope function and the Green's function. Hence, the Green's function of the unperturbed system is, $$G_o(l,l',\epsilon) = \sum_m \frac{J_{l+m}J_{l'+m}}{\epsilon - \epsilon_m} = \sum_m \frac{J_{l+m}J_{l'+m}}{\epsilon - \epsilon_o - m\hbar w_B}$$

The corresponding retarded (advanced) Green's function can now be evaluated. Expressing "$\epsilon$" in terms of "y", $y=(\epsilon-\epsilon_o)/\hbar w_B$, the retarded (advanced) Green's function is $$G_o^\pm(l,l',y) = \frac{1}{\hbar w_B} \lim_{\delta \to 0} \sum_m \frac{J_{l+m}J_{l'+m}}{y - m \pm i\delta} =$$

$$\frac{\pi(-1)^k}{\hbar w_B} J_{l_<-y}J_{l_>+y}\left[P\frac{1}{\sin\pi y} \mp i\sum_m \delta(y-m)\right]$$

where $l_<(l_>)$ is the smaller (larger) one of $l,l'$. It should be noted that $G^\pm_o(l,l',y)$ consists of a principal part and an imaginary part; the imaginary part of the Green's function is directly related to the density of the states as found in $$\rho(l,y) = \mp \frac{1}{\pi} Im[G_o^\pm(l,l',y)] = \frac{(-1)^k}{\hbar w_B} J_{l_<-y}J_{l_>+y} \sum_m \delta(y-m)$$

where the $\delta$-functions in the density of the states indicates that the energy spectrum for the unperturbed system is Wannier Stark ladders. As the impurities are turned on, the general solution of the nearest-neighbor tight-binding band with the given band dispersion is $$F_n(l) = gF_n^{(o)}(l) + \sum_{l'}\sum_{l''} V_n^o(l',l'')G_o(l,l',y)F_n(l'')$$

where $F^{(o)}_n$ is the solution of the previous homogeneous equation, and g is a constant (for $y \neq \{m\}$, g=0 and for $y=\{m\}$, g=1).

To calculate the discrete Wannier Stark levels for the system with single and double impurities, g is set to be equal to zero in the previous equation. For a single Slater-Koster impurity located at $l_o$, $$F_n(l) = V_oG_o(l,l_o,y)F_n(l_o)$$

the continuity condition of $F_n(l)$ at $l=l_o$ requires $$1 - V_oG_o((l_o,l_o,y) = 0$$

where "y", the energy eigenvalues for the single impurity structure, can be solved numerically.

For two Slater-Koster impurities located at $l_o$ and $l_1$, $$F_n(l) = V_oG_o(l,l_o,y)F_n(l_o) + V_1G_o(l,l_1,y)F_n(l_1)$$

the continuity of $F_n(l)$ at $l=l_o$ and $l=l_1$ results in two linear equation of $F_n(l_o)$ and $F_n(l_1)$, and the non-trivial solutions of $F_n(l_o)$ and $F_n(l_1)$ require that $$\begin{vmatrix} 1 - V_oG_o(l_o,l_o,y) & -V_1G_o(l_o,l_1,y) \\ -V_oG_o(l_1,l_o,y) & 1 - V_1G_o(l_1,l_1,y) \end{vmatrix} = 0$$

Figure 1:
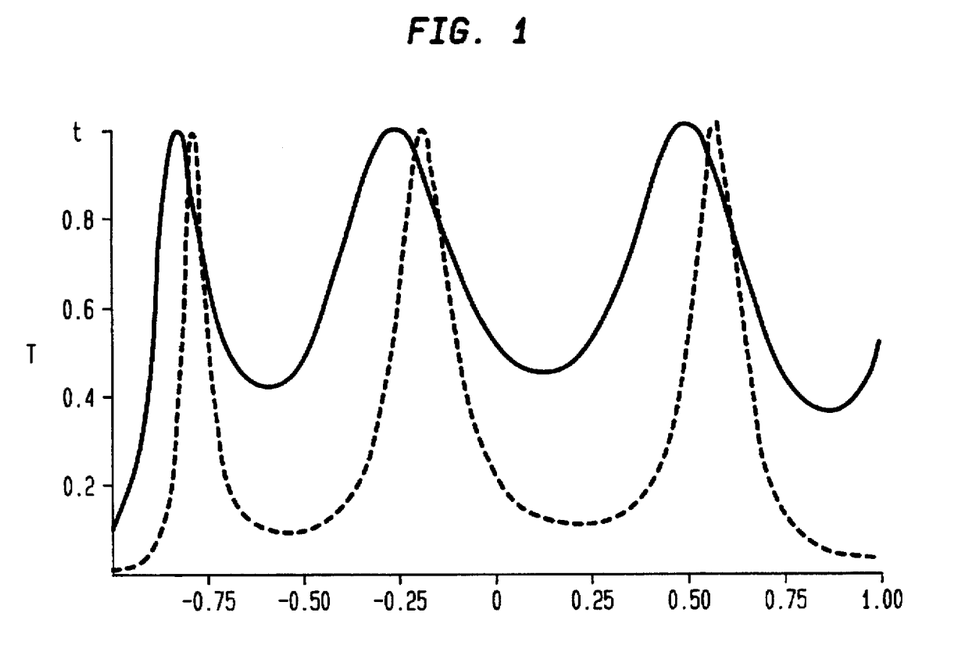
FIG. 1 depicts the transmission coefficient, T, versus normalized energy $y=(E_n-\epsilon_o)/2\epsilon_1$ in a device according to the present invention having a double impurity wherein the distance between the two impurities is l=4 lattice spacing, and the relative impurity strengths are $V_o/2\epsilon_1=0.5$ (solid line) and $V_o/2\epsilon_1=1.0$ (dashed line).

The energy spectrum for the double impurity barriers can also be solved numerically by finding roots of the previous equation. FIGS. 1a and 1b are graphical representations of the energy spectra $y=(\epsilon-\epsilon_o)/\hbar w_B$ in a device according to the present invention having a double impurity wherein the distance between the two impurities is l=4 lattice spacing, and the relative impurity strengths are for FIG. 1a, $V_o/2\epsilon_1=0.5$ and for FIG. 1b, $V_o/2\epsilon_1=1.0$. These results show that for relatively low potential barriers and high electric field, the energy levels are almost uniform, resembling the Wannier Stark ladder, and the barriers act as perturbations. For relatively low field and high potential barriers, the Wannier Stark uniformity of the levels becomes distorted.

The non-uniformity of the Wannier Stark levels introduced by the presence of the impurities alters the time dependence of the envelope function for the Bloch electron. For the perfect crystal with no impurities, the time dependent envelope function is $$\left\{ f_n^{(o)}(r,t) = \sum_{l'} K_n(r-l';t,0)f_n(l',0) \right\}$$

where $f_n(l',0)$ is the initial value of the envelope function, determined by the initial condition of the Bloch electron, $K_n(l-l';t,t')$ is the time evolution kernel for the Bloch electron in the unperturbed crystal. For the one-dimensional nearest-neighbor tight-binding band, the time evolution kernel can be expanded in the Bessel function basis (eigenfunction of the time-independent equation) as, $$K_n(l-l';t,t') = \sum_m J_{l-l'+m}J_m e^{-i\frac{\epsilon_o}{\hbar} + mw_B(t-t') - i(l-l')w_Bt'}$$

So that the time dependent envelope function $f^o_n(r,t)$ is a sum of simple harmonic oscillations with frequencies $\epsilon_o/\hbar + mw_B$, which corresponds to the unperturbed Stark levels. When the impurities are present, the time dependence of the envelope function will reflect the perturbations due to the impurities. The connection between the energy spectrum calculated for single and double impurity barrier and the time evolution of the time-dependent envelope function yields $$f_n(r,t) = \sum_{l'} K_n(r-l';t,0)f_n(l',0) -$$

$$\frac{i}{\hbar}\sum_{l'}\sum_l \int_t^0 K_n(r-l;t,t')V_n(l,l',t')f_n(l',t')dt'$$

When $V_n(l,l',t)$ is a single or combination Slater-Koster impurities, then $f_n(l',t')$ in the integrand, becomes the time dependent envelope functions at the impurity sites, and can be evaluated through the use of the Laplace transforms. To derive the explicit time dependent envelope functions at the sites of the impurities, the inverse Laplace transform of $L[f_n(l_o),s]$ and $L[f_n(l_1),s]$ contained in the integrand are found to be an infinite number of poles along the imaginary axis in the complex plane of "s". The locations of the poles coincide exactly with the energy spectra calculated from the distorted Wannier Stark ladder. Using the residue theorem, it is found that the time dependent envelope functions at the sites of the impurities have a time dependence given by $$f_n(l_0,t) = \sum_{m'} A_{m'}(l_0) e^{-i\frac{\epsilon_0}{\hbar} + y_{m'}w_B)t}$$

$$f_n(l_1,t) = \sum_{m'} A_{m'}(l_1) e^{-i\frac{\epsilon_0}{\hbar} + y_{m'}w_B)t}$$

Hence, the envelope functions at impurity sites are equal to a summation of simple oscillations with frequencies $\epsilon_o/\hbar = y_m w_B$. These frequencies mix into time dependent envelope functions at all other lattice sites through the integration over the envelope functions at impurity sites and the time evolution kernel. For example, for a single Slater-Koster impurity, where the integral mixes the frequencies of the Wannier Stark $$f_n(r,t) = \sum_{l'} K_n(l-l';t,0) f_n(l',0) - \frac{i}{\hbar} V_0 \int_0^t K_n(r-l_0;t,t') f_n(l_0,t') dt'$$

levels without the impurities as $\epsilon_o/\hbar + m w_B$ and with the impurity as $\epsilon_o/\hbar + y_m w_B$. The explicit time dependence is obtained by substituting the expanded time evolution kernel, given above, for $K_n(r-l_o;t,t')$ and the time dependence of the time dependent envelope function, also given above, for $f_n(l_o,t')$ into the equation given directly above, and evaluating the integral as, $$f_n(r,t) = \sum_{l'} K_n(l-l';t,0) f_n(l',0) -$$

$$\frac{V_0}{\hbar w_B} \sum_m \sum_{m'} \frac{J_{r-l_0+m} J_m A_{m'}(l_0)}{m-r+l_0-y_{m'}} [e^{-i\frac{\epsilon_0}{\hbar}t + (r-l_0-y_{m'})w_B t} - e^{-i\frac{\epsilon_0}{\hbar}t + m w_B t}]$$

where the $A_{m'}(l_o)$ are derived from the inverse Laplace transform of $L[f_n(l_o),s]$ and can be expressed as, $$A_{m'}(l_0) = \frac{1}{\alpha_{m'}} \sum_{m''} \frac{C_{m''}(l_0)}{y_{m'} - m''}$$

where $$\alpha_{m'} = -2 \frac{V_0}{\hbar w_B} \frac{d}{dy} \left( \frac{\pi}{\sin \pi y} J_{-y} J_y \right)_{y=y_{m'}}$$

and $C_{m'}(l_o)$ are determined by the initial condition as, $$C_{m'}(l_0) = J_{m'} \sum_{l'} J_{l_0-l'+m'} f_n(l',0)$$

Transmission Modulation by AC Field Tuning

From the above, it can be shown that under special tuning conditions, a canonical band dispersion can be found for the band deformed by the superimposed electric field. According to the present invention, this specialized tuning results in a DC component of the velocity for which the transport through single and double barriers may be applied to a device structure. In this section, the above sections will be used to define the transmission of the Bloch electron through single and double Slater-Koster impurity potential under the influence of the time dependent electric field.

The general form of the superimposed uniform and oscillatory electric field is $$\vec{E} = \vec{E}_o + \vec{E}_1 \cos wt$$

where $E_o$, $E_1$ are the strength of the DC and the AC field respectively, $\omega$ is the frequency of the AC field. As the AC and the DC fields are tuned so the Bloch frequency $\omega_B$ is a multiple of the AC frequency, i.e., $\omega_B = M_o \omega$, where $M_o$ is an integer, the equivalent band dispersion for the one dimensional nearest-neighbor tight-binding band in the electric field is $$\overline{\epsilon}_n(K) = \epsilon_o + 2\overline{\epsilon}_1 \cos Ka$$

where $\epsilon_1$ is the deformed band parameter, and $$\overline{\epsilon}_1 = \epsilon_1 (-1)^{M_0} J_{M_0}(\alpha), \alpha = \frac{eE_1 a}{\hbar \omega}$$

It is clear that for the one-dimensional nearest-neighbor tight-binding band, the equivalent band dispersion $\epsilon_n(K)$ has the same form as the original band dispersion, but with a different band parameter, or a modified band width. Further, it is clear to see that the equivalent band width is $W_n = |J_{M_o}(\alpha)| W_n$. Since the absolute value of the Bessel function with integer order $|J_{M_o}(\alpha)|$ is always less than or equal to one, the applied electric field reduces the equivalent bandwidth.

Using the results of zero-field transmission coefficient for single and double impurity barriers and the result of the band deformation, the transmission coefficients for the Bloch electron in the tuned electric fields can be calculated. For the single impurity, the transmission coefficient is $$T = \frac{1}{1 + \left( \frac{V_0}{2\overline{\epsilon}_1 \sin u} \right)^2}$$

and for two Slater-Koster impurities, the transmission coefficient is $$T = \frac{1}{1 + 4\left( \frac{V_0}{2\overline{\epsilon}_1 \sin u} \right)^2 \left[ \frac{V_0}{2\overline{\epsilon}_1 \sin u} \sin u l - \cos u l \right]^2}$$

It should be noted that the modified band parameter always appears together with the impurity strength in the transmission coefficients as $V_o/2\epsilon_1$; and since $$\frac{V_0}{2\overline{\epsilon}_1} = \frac{1}{(-1)^{M_0} J_{M_0}(\alpha)} \cdot \frac{V_0}{2\epsilon_1} = \frac{\overline{V}_0}{2\epsilon_1},$$

$$\overline{V}_0 = \frac{V_0}{(-1)^{M_0} J_{M_0}(\alpha)}$$

then the deformed band parameters in the transmission coefficients can be treated as if the electron tunnels through the modified barriers in an unaltered band. In other words, the tuned electric field modifies the impurity barrier strength. As $\alpha = eE_1 a/\hbar w$ is tuned, $|J_{M_o}(\alpha)|$ will go through the values from zero to some maximum number (less than one), and the modified barrier strength will vary from a value greater than $V_o$ to $\infty$. As a consequence, the transmission coefficients vary, and tend to have a narrowed width for the resonances. To illustrate the effects of the tuned AC and DC fields on the transmission coefficients, take for example $M_o=1$, i.e., $\omega_B=\omega$; by varying $\alpha=eE_1a/\hbar\omega$ from 0 to 2, the value of $J_1(\alpha)$ varies from 0 to a maximum value of 0.5815 at $\alpha\approx1.8$, and then decreases to 05.767 at $\alpha\approx2.0$.

Figure 2:
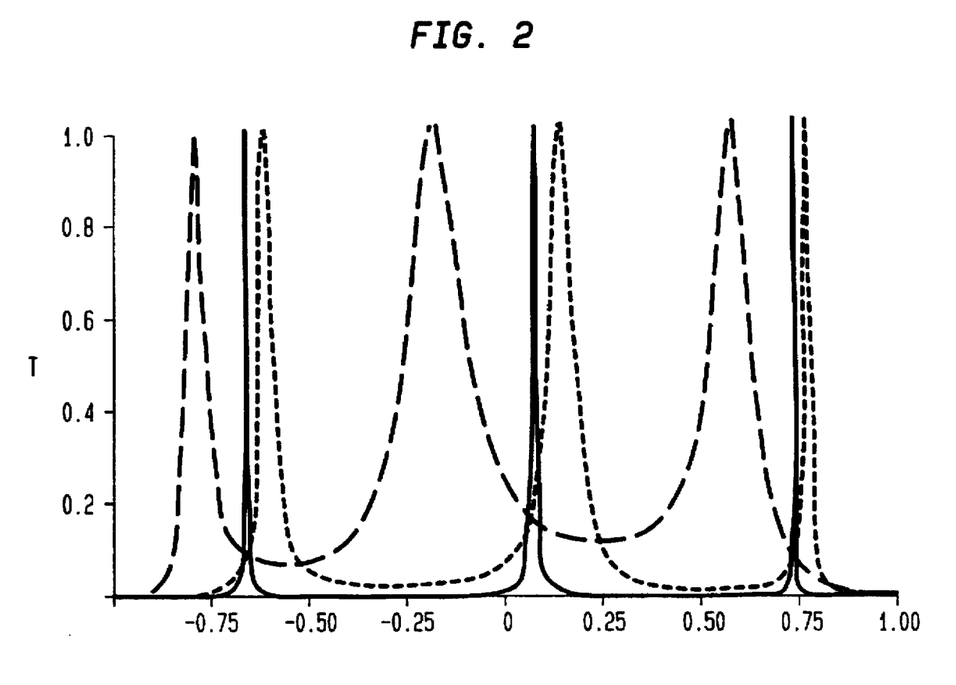
FIG. 2 is a graphical representation of the transmission coefficient T versus the normalized energy $(E_n-\epsilon_o)/2\epsilon_1$ for a device according to the present invention having a double impurity structure with the distance between the two impurities l=4, and the relative impurity strength $V_0/2\epsilon_1=1.0$, wherein the longer dashed line is for the zero field case, the small dashed line is for $M_o=1$, $\alpha=2.0$, and the solid line is for $M_o=1$, $\alpha=0.5$.

FIG. 2 is a graphical representation of the transmission coefficient T versus the normalized energy $E_n-\epsilon_o)/2\epsilon_1$ for a double impurity structure with the distance between the two impurities l=4, and the relative impurity strength $V_o/2\epsilon_1=1.0$, wherein the longer dashed line is for the zero field case, the small dashed line is for $M_o=1$, $\alpha=2.0$, $J_1(\alpha)=0.5767$ and the solid line is for $M_o=1$, $\alpha=0.5$, $J_1(\alpha)=0.2423$. It is evident that the width of the resonances narrows significantly for the increased equivalent barrier height. It should be noted that the minus sign of $(-1)^{Mo}$ has the effect of inverting the transmission coefficient about $(E_n-\epsilon_o)/2\epsilon_1$ for odd integer values of $M_o$. This transmission modulation phenomena according to the present invention is to induce three terminal effects in two terminal devices through the use of modulating fields. It also provides an example of the use quantum control in effecting device characterization.

Preferred Embodiments

Given the above description of the theory behind the present invention, it is possible to engineer particular nanoscale and mesoscale semiconductor structures so that by altering or tuning a externally applied electric field at a frequency(ies) equal to the Bloch frequency divided by an integer, the band engineered barriers/impurities of the device will be altered and a substantial modulation of the current ratio will be achieved. To implement this method, several different embodiments of the invention are anticipated. These embodiments include simply band engineering a series of semiconductor regions in a longitudinal direction, laterally inducing the barriers with electrical contacts being applied perpendicular (two dimensional current flow) or parallel (one dimensional current flow) to the current flow, or doping a substrate/waveguide/network with impurities or defects having a predetermined potential barrier. When these structures are biased by a sinusoidal, external, alternating electric field, the band engineered or induced potential barriers are raised to an arbitrarily large magnitude as compared to the bare barrier potential and thus, the current ratio is substantially modified.

Figure 3:
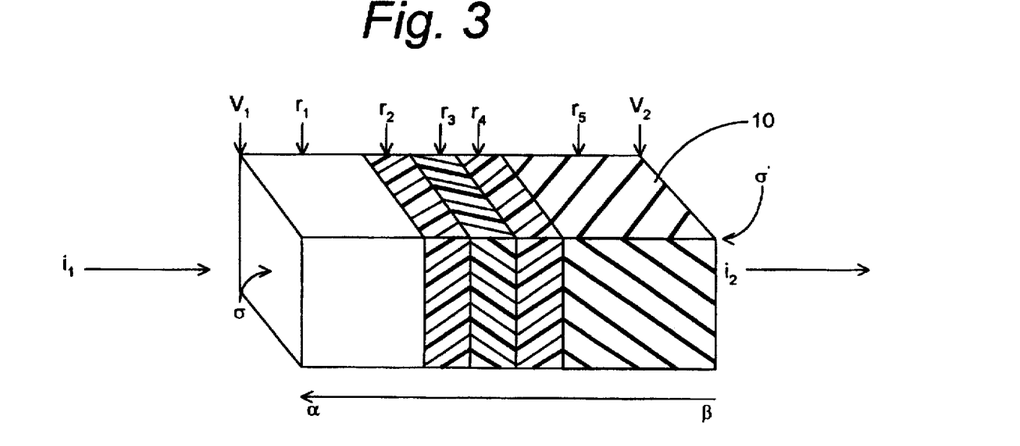
FIG. 3 is perspective illustration of one embodiment of the present invention wherein the potential barrier structures are placed normal to the plane of current.

FIG. 3 illustrates one generic embodiment of the present invention as a field controlled modulator for nanoscale systems using a band-engineered lattice. This modulator consists of a current carrying region 10 having an entrance cross section $\sigma$ and an exit cross-section $\sigma'$. The current carrying region 10 is constructed so that the time-dependent potential varies from $V_1$ in plane $\alpha$ to $V_2$ in plane $\beta$. The regions r1 through r5 have band engineered potential profiles such that r2 and r4 serve as barriers to the current transport from entrance plane $\alpha$ to exit plane $\beta$. As stated above and depending on the application, these potential profiles of the regions r1 through r5 are substantially modified when externally biased by an alternating electric field which is equal to the Bloch frequency divided by an integer. When so externally biased, the current $i_1$ is permitted to tunnel through the structure, but only after substantial modulation to a current $i_2$ in accordance with the theory and equations set forth above.

Figure 4A:
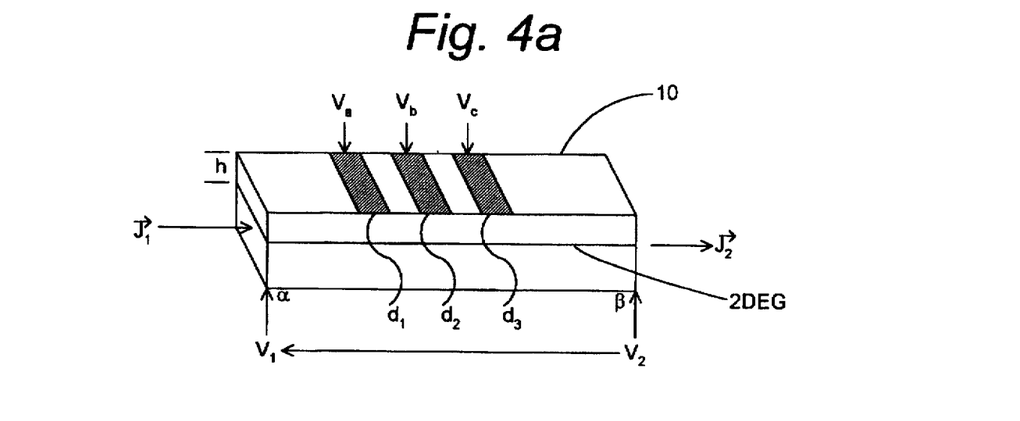
FIGS. 4a and 4b are perspective illustrations of two different embodiments of the present invention wherein the potential barrier structures are displaced laterally of a layered structure having a current carrying two dimensional gas.
Figure 4B:
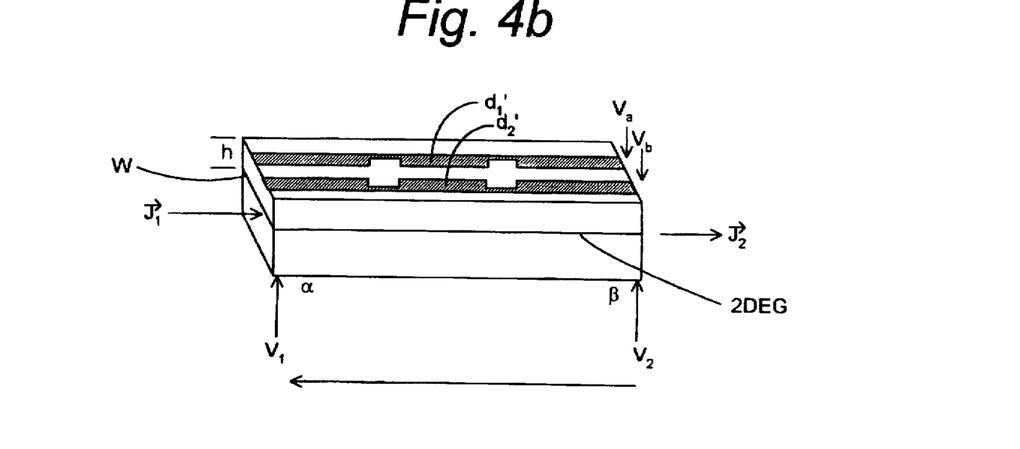

FIGS. 4a and 4b illustrate another embodiment of the present invention wherein the necessary potential barriers are induced laterally. The device of FIG. 4a includes laterally deposited regions d1, d2, and d3 to induce potential barriers in the plane of the two-dimensional electron (or hole) gas. The magnitudes of these induce potential barriers in the planes of the currents are determined by the applied potentials $V_a$, $V_b$, and $V_c$, respectively, as well as by the geometrical (dimensional) parameters of the regions d1–d3 and the depth of the current, h. The device of FIG. 4b differs from that of FIG. 4a only in the respect that the deposited regions d1' and d2' are deposited parallel to the current flow in order to establish a one-dimensional current flow of variable width W as opposed to a two-dimensional current flow of the device of FIG. 4a. Similar to the device of FIG. 4a, the induced potential barriers in the planes of the current is determined by the applied potentials of $V_a$ and $V_b$ as well as the geometric parameters of regions d1 and d1 and the depth of the current h. As with the device of FIG. 3, the devices of FIG. 4a and FIG. 4b also have an entrance and exit surfaces $\alpha$ and $\beta$ respectively, wherein the devices of FIGS. 4a and 4b are constructed so that the time-dependent potential varies from $V_1$ in plane $\alpha$ to $V_2$ in plane $\beta$ when the predetermined barrier potentials are induced by the applied potentials of $V_a$, $V_b$ and/nor $V_c$.

Figure 5:
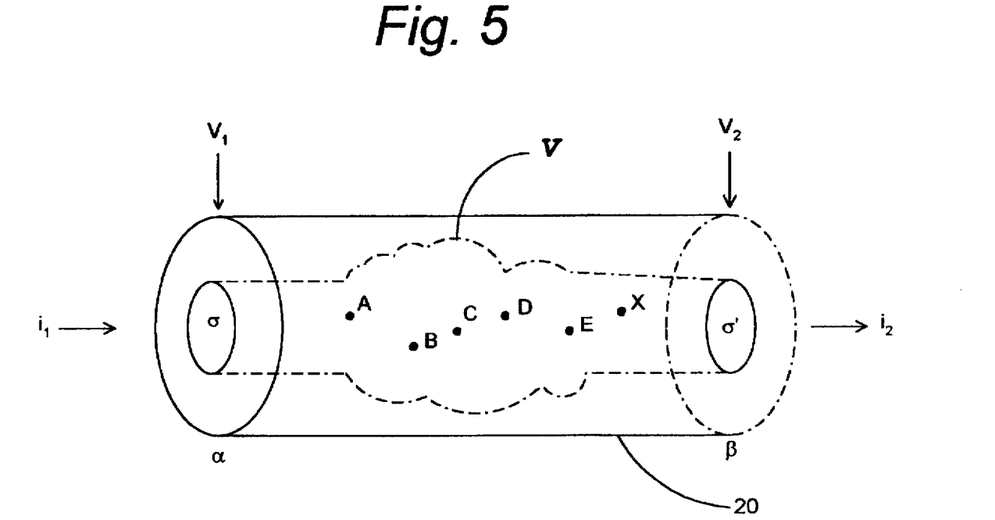
FIG. 5 is a detailed perspective view of another embodiment of the present invention wherein isolated impurities are used as the potential barrier structures.
Figure 6:
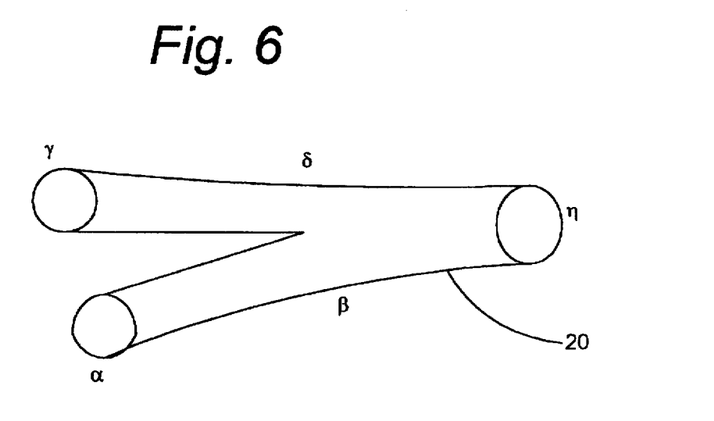
FIG. 6 is a further perspective view of a further nanoscale network wherein the present invention may be utilized; each arm of this structure represents an element such as that in FIG. 5.
Figure 7:
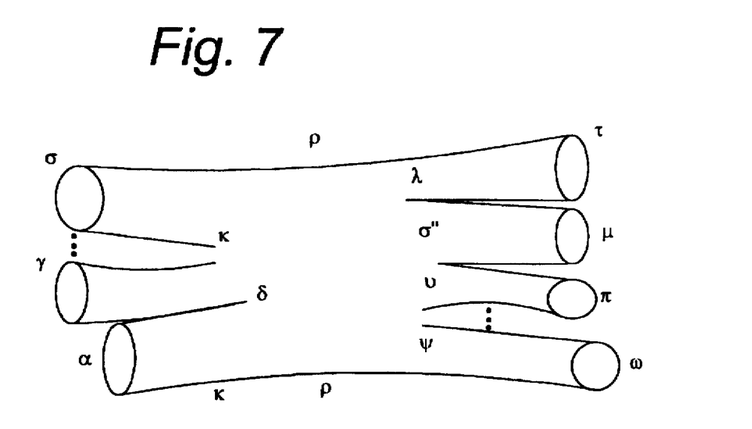
FIG. 7 is an n-arm generalization of the network depicted in FIG. 6; the basic elements of this network are the separate arms which are as in FIG. 5 for the embodiment based on impurity barriers.

FIGS. 5, 6, and 7 illustrate still another embodiment of the present invention wherein the substantial modulation of the current ratio is provided by impurity or defects in a single current carrying region or in a network of current carrying regions. As shown in FIG. 5, the current carrying region 20 is constructed so that the time-dependent potential varies from $V_1$ in plane $\alpha$ to $V_2$ in plane $\beta$. Similar to the device of FIG. 3, the device of FIG. 5 also has an entrance cross section $\sigma$ and an exit cross-section $\sigma'$. The current passing from entrance plane $\alpha$ to the exit plane $\beta$ is constrained to flow along a channel of arbitrary shape V, which contains a number of defects or impurities, here labelled as A, B, C, D, E, . . . X. In operation, a time-dependent external field is applied across the region from $\alpha$ to $\beta$ which leads to the renormalization of the barrier strengths of the impurities/defects when the frequency of the applied electric field multiplied by an integer is equal to the Bloch frequency. Under these conditions, as with the other devices described above, the transmission probability is altered and the current ratio $i_2/i_1$ is modulated strongly.

With this description one skilled in the art could devise any number of devices including a network of basic units, as in FIG. 6. FIG. 6 shows the combination of several basic units having entrance and exit planes $(\alpha,\beta)$, $(\gamma,\delta)$ and $(\delta/\beta, \eta)$. Specifically, FIG. 6 illustrates a more complicated network with three of the basic units wherein each entrance and exit is represented by a different character similar to FIG. 5; the embodiment of FIG. 6 is a 3-arm realization of a single network of 3 of the basic device such as that depicted in FIG. 5. FIG. 7 illustrates an n-arm generalization of the 3-arm network of FIG. 6, wherein the various greek letters represent entrance and exit planes as described above in reference to FIGS. 5 and 6. The device of FIG. 7 may be engineered for most any logic circuit/switching network given of the disclosure above.

Accordingly and although the present invention has been described with regard to specific embodiments, the inventors wish it to be understood that these descriptions are merely examples of several methods of carrying out the present invention. Accordingly, this invention should only be limited by the present claims.

What is claimed is:

1. A quantum scale current modulator comprising:
   a quantum sized electron transport media made of a semiconductor material;
   means to provide a potential barrier within said electron transport media; and
   means to apply an alternating external electric field to said electron transport media wherein said alternating external electric field is applied at a frequency equal to a Bloch frequency divided by an integer and said alternating external electric field alters said potential barrier.

2. The current modulator of claim 1 wherein the means to apply an alternating external electric field includes a means to apply a plurality of alternating external electric fields.

3. A current modulator of claim 1 wherein the means to provide a potential barrier to said transport media includes at least two quantum barrier regions disposed longitudinally within said transport media.

4. A current modulator of claim 1 wherein the means to provide a potential barrier to said transport media includes a conductor disposed laterally on said transport media and parallel to a current flow within said transport media.

5. A current modulator of claim 4 wherein the current transport media includes a two dimensional electron gas.

6. A current modulator of claim 1 wherein the means to provide a potential barrier to said transport media includes a conductor disposed laterally on said transport media and perpendicular to a current flow within said transport media.

7. A current modulator of claim 6 wherein the current transport media includes a two dimensional electron gas.

8. A current modulator of claim 1 wherein the means to provide a potential barrier to said transport media includes a plurality of impurities disposed within said transport media, the plurality of impurities having a predetermined potential barrier strength.

9. A current modulator of claim 8 wherein the said transport media includes at least one entrance plane and one exit plane.

10. A current modulator of claim 8 wherein said transport media includes a plurality of entrance and exit planes.

11. A logic circuit comprising:

a quantum sized electron transport media made of a semiconductor material;

means to provide a potential barrier within said electron transport media; and means to apply an alternating external electric field to said electron transport media wherein said alternating external electric field is applied at a frequency equal to a Bloch frequency divided by an integer and said alternating external electric field alters said potential barrier.

12. A logic circuit of claim 11 wherein the means to provide a potential barrier to said transport media includes a plurality of impurities disposed within said transport media, the plurality of impurities having a predetermined potential barrier strength.

13. A logic circuit of claim 12 wherein the said transport media includes at least one entrance plane and one exit plane.

14. A logic circuit of claim 12 wherein said transport media includes a plurality of entrance and exit planes.

* * * * *